(12) United States Patent
Yoon

(10) Patent No.: US 7,989,254 B2
(45) Date of Patent: Aug. 2, 2011

(54) METHOD FOR FABRICATING COLOR FILTER USING SURFACE PLASMON AND METHOD FOR FABRICATING LIQUID CRYSTAL DISPLAY DEVICE

(75) Inventor: Min-Sung Yoon, Paju (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/941,853

(22) Filed: Nov. 8, 2010

(65) Prior Publication Data

US 2011/0151605 A1 Jun. 23, 2011

(30) Foreign Application Priority Data

Dec. 18, 2009 (KR) .................. 10-2009-0127427

(51) Int. Cl.
*H01L 21/00* (2006.01)
(52) U.S. Cl. .................. 438/70; 257/59; 438/29
(58) Field of Classification Search .................. 438/70; 257/59, E31.121
See application file for complete search history.

(56) References Cited

U.S. PATENT DOCUMENTS

| | | |
|---|---|---|
| 5,451,980 A | 9/1995 | Simon et al. |
| 5,570,139 A | 10/1996 | Wang |
| 5,973,316 A | 10/1999 | Ebbesen et al. |
| 5,986,808 A | 11/1999 | Wang |
| 5,991,000 A | 11/1999 | Shimabukuro et al. |
| 6,040,936 A | 3/2000 | Kim et al. |
| 6,097,456 A | 8/2000 | Wang |
| 6,122,091 A | 9/2000 | Russell et al. |
| 6,236,033 B1 | 5/2001 | Ebbesen et al. |
| 6,285,020 B1 | 9/2001 | Kim et al. |
| 6,441,298 B1 | 8/2002 | Thio |
| 6,992,826 B2 | 1/2006 | Wang |
| 7,085,220 B2 | 8/2006 | Fujikata et al. |
| 7,110,154 B2 | 9/2006 | Ballato et al. |
| 7,206,114 B2 | 4/2007 | Ballato et al. |
| 7,248,297 B2 | 7/2007 | Catrysse et al. |
| 7,417,219 B2 | 8/2008 | Catrysse et al. |
| 7,420,156 B2 | 9/2008 | Kim et al. |
| 7,816,169 B2* | 10/2010 | Fan et al. ............... 438/70 |
| 7,897,426 B2* | 3/2011 | Maehara ............... 438/70 |
| 2006/0284829 A1* | 12/2006 | Moriyama et al. ...... 345/107 |
| 2009/0027329 A1 | 1/2009 | Choi et al. |
| 2009/0034055 A1 | 2/2009 | Gibson |
| 2009/0086064 A1 | 4/2009 | Mackey |
| 2009/0091644 A1 | 4/2009 | Mackey |
| 2010/0091217 A1* | 4/2010 | Kim et al. ............... 349/62 |

\* cited by examiner

*Primary Examiner* — Thao P. Le
(74) *Attorney, Agent, or Firm* — Birch, Stewart, Kolasch & Birch, LLP

(57) ABSTRACT

Discussed are methods for fabricating a color filter using a surface plasmon and a liquid crystal display (LCD) device capable of enhancing a transmittance ratio of an LC panel and simplifying entire processes, by forming a transmissive pattern consisting of a plurality of sub-wavelength holes having a period on a metal layer, and by implementing colors by selectively transmitting light of specific wavelengths with using a surface plasmon phenomenon.

25 Claims, 17 Drawing Sheets

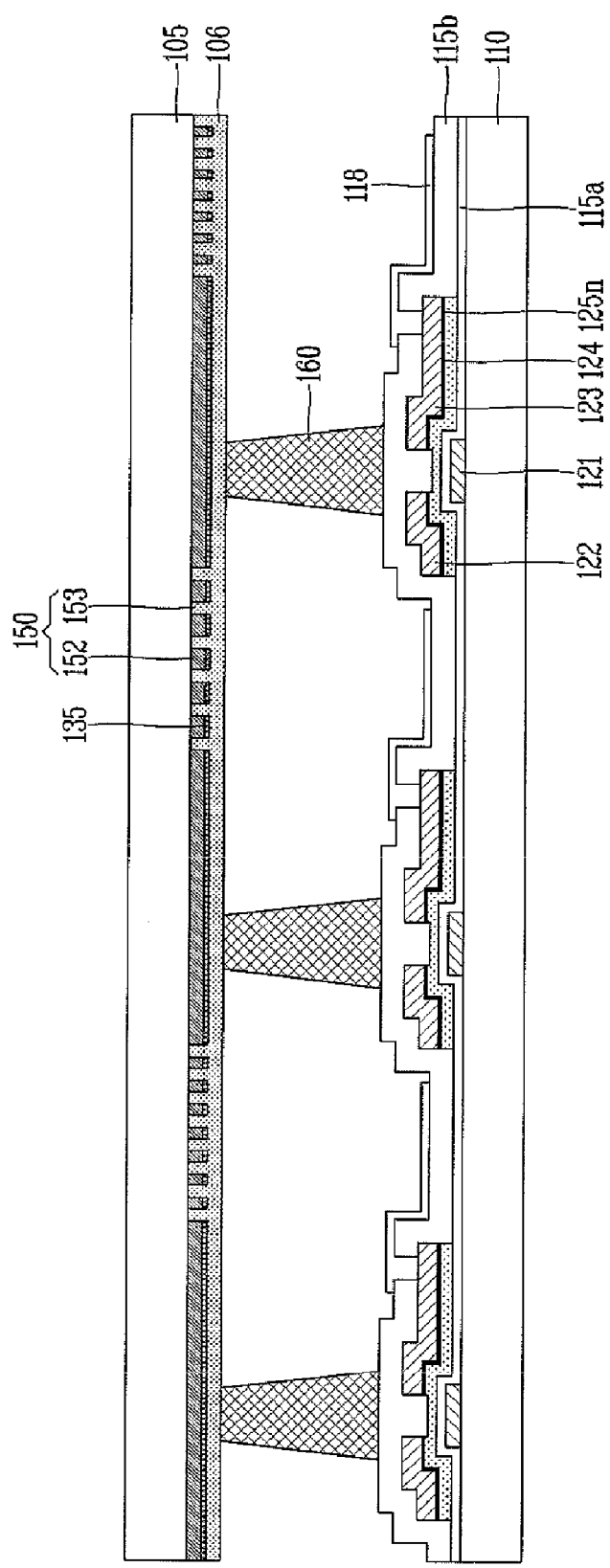

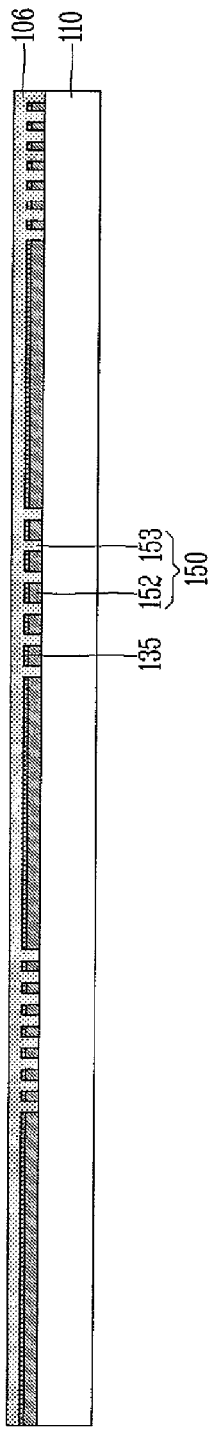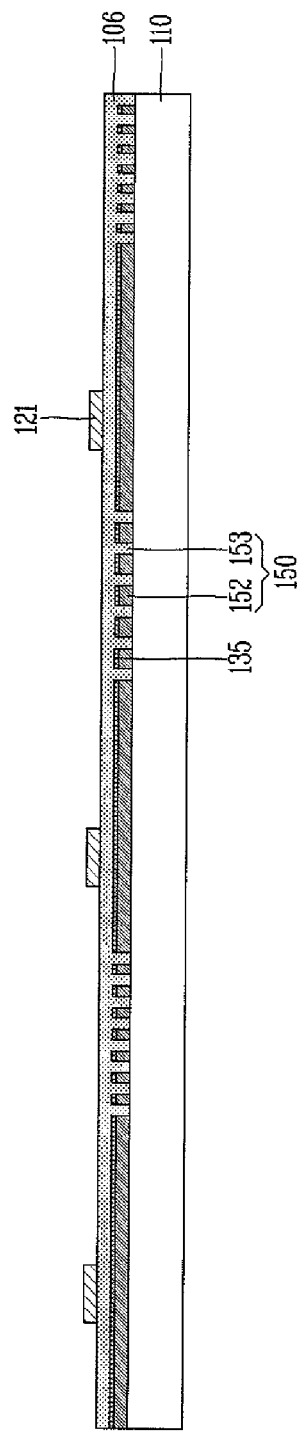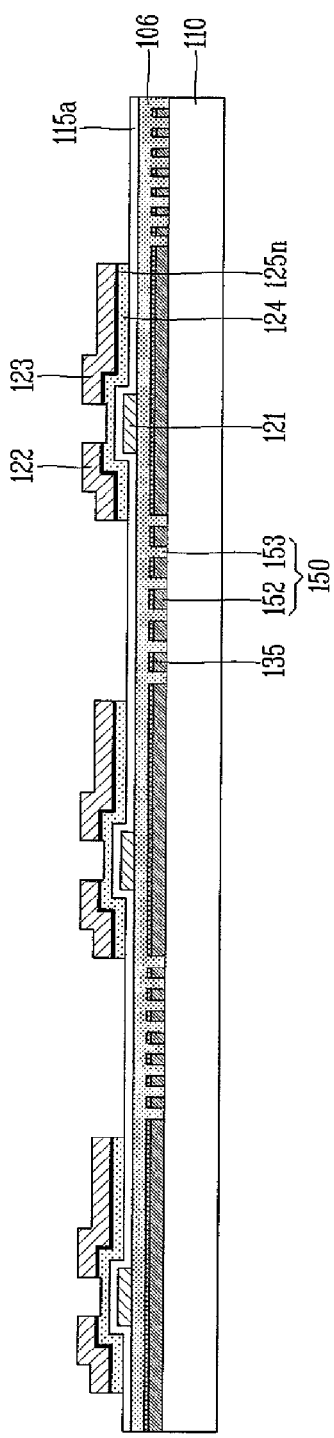

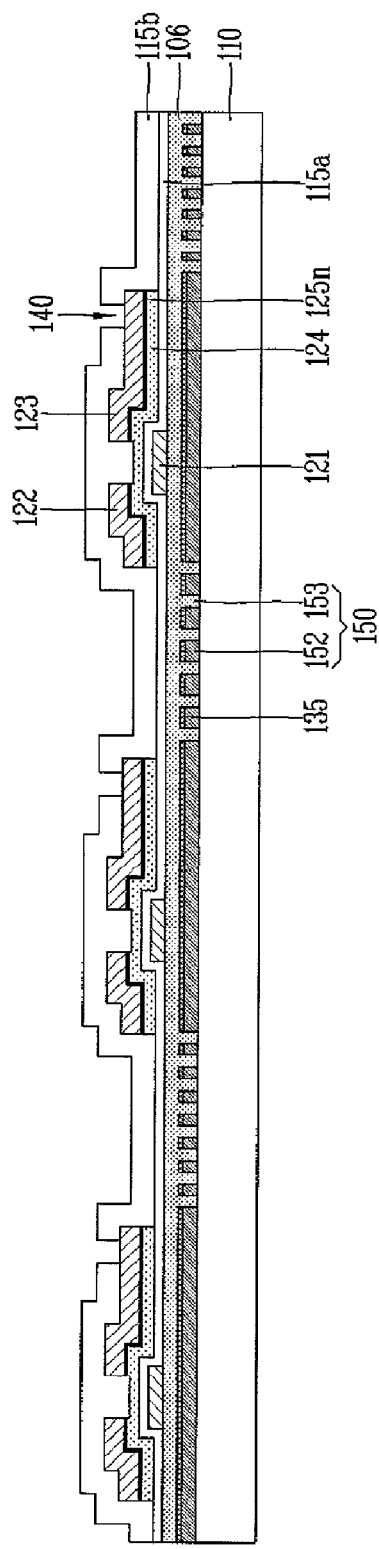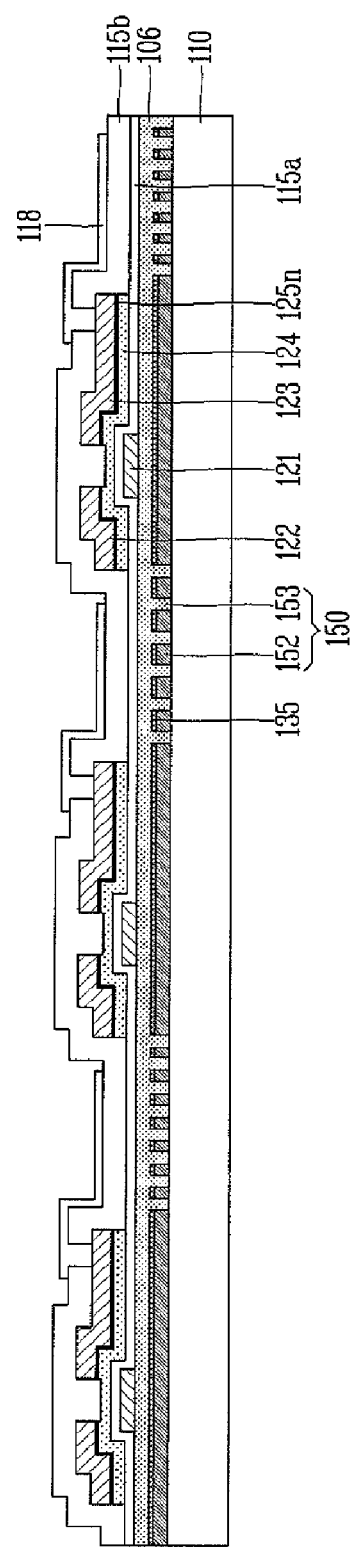

METHOD FOR FABRICATING COLOR FILTER USING SURFACE PLASMON AND METHOD FOR FABRICATING LIQUID CRYSTAL DISPLAY DEVICE

CROSS-REFERENCE TO RELATED APPLICATION

Pursuant to 35 U.S.C. §119(a), this application claims the benefit of earlier filing date and right of priority to Korean Application 10-2009-0127427, filed on Dec. 18, 2009, the contents of which are incorporated by reference herein in its entirety.

BACKGROUND OF THE INVENTION

1. Field of the Invention

The present invention relates to a method for fabricating a color filter using a surface plasmon and a liquid crystal display (LCD) device, and more particularly, to a method for fabricating a color filter using a surface plasmon and having a three-dimensional (3D) pattern structure provided with a transmissive pattern for selectively transmitting light of a specific wavelength, and a method for fabricating an LCD device.

2. Discussion of the Related Art

As concerns about an information displays and demands for portable information media are increased, research and commercialization of flat panel displays (FPD) replacing the conventional display apparatus, Cathode Ray Tubes (CRT) are actively ongoing. One of these flat panel displays, a Liquid Crystal Display (LCD) device serves to display an image by using optical anisotropy of a liquid crystal (LC). Owing to an excellent resolution, color reproduction characteristic, and picture quality, the LCD device is being actively applied to a notebook, a desk top monitor, etc.

The LCD device is largely comprised of a color filter substrate, an array substrate, and an LC layer interposed between the color filter substrate and the array substrate.

The LCD device is fabricated through a plural number of mask processes (i.e., photo lithography process). Accordingly, required is a method for reducing the number of mask processes for enhanced productivity.

Hereinafter, a structure of the related art LCD device will be explained in more detail with reference to FIG. 1.

FIG. 1 is a disassembled perspective view schematically showing a structure of the related art LCD.

As shown in FIG. 1, the LCD device largely comprises a color filter substrate 5, an array substrate 10, and an LC layer 30 interposed between the color filter substrate 5 and the array substrate 10.

The color filter substrate 5 consists of a color filter (C) composed of a plurality of sub color filters 7 for implementing red, green and blue (RGB) colors, a black matrix 6 for dividing the sub color filters 7 from each other and shielding light passing through the LC layer 30, and a transparent common electrode 8 for applying a voltage to the LC layer 30.

The array substrate 10 consists of a plurality of gate lines 16 and data lines 17 arranged in horizontal and vertical directions to define a plurality of pixel regions (P), Thin Film Transistors (TFT), switching devices formed at intersections between the gate lines 16 and the data lines 17, and pixel electrodes 18 formed in the pixel regions (P).

The color filter substrate 5 and the array substrate 10 facing each other are bonded to each other by a sealant (not shown) formed on an outer periphery of an image display region, thereby constituting an LC panel. The color filter substrate 5 and the array substrate 10 are bonded to each other by alignment keys (not shown) formed at the color filter substrate 5 or the array substrate 10.

In order to prevent light leakage due to an alignment error when bonding the two substrates to each other, a line width of the black matrix is set to be wide, thereby obtaining an alignment margin. This may reduce an aperture ratio of the LC panel.

The general color filter used in the LCD device implements colors by absorbing light of unnecessary colors for disappearance with using pigments or dyes, and by selectively transmitting light of desired colors. This may allow only one of RGB colors, from white incident light, to be transmitted to one sub-pixel. Accordingly, it is difficult to have a transmittance ratio more than 30%. Due to this low transmittance ratio of the LC panel, power consumption by a backlight is increased.

FIG. 2 is an exemplary view schematically showing a transmittance ratio of the LC panel when applying a color filter using a general pigment dispersing method.

Referring to FIG. 2, as light incident from a backlight has a decreased optical amount decreased while sequentially passing through a polarizer, a TFT array, an LC and a color filter, a transmittance ratio is reduced to 5% or less than.

Here, the polarizer, the TFT array and the color filter approximately have transmittance ratios of ~40%, 45~55% and ~25%, respectively.

The general color filter is fabricated with complicated processes since it repeatedly undergoes color resist coating, exposure to light, development and hardening processes according to each color.

Furthermore, in order to fabricate the color filter on the color filter substrate, color filter processing lines have to be implemented separately from TFT processing lines. This may increase line installation costs.

SUMMARY OF THE INVENTION

Therefore, an object of the present invention is to provide a method for fabricating a color filter using a surface plasmon capable of enhancing an aperture ratio and a transmittance ratio of an LC panel, by using a surface plasmon instead of using the general dyes or pigments, and a method for fabricating a liquid crystal display (LCD) device.

Another object of the present invention is to provide a method for fabricating a color filter using a surface plasmon capable of preventing oxidation of a surface of a metal layer for the color filter, and capable of replacing an over coating layer by the metal layer, and a method for fabricating an LCD device.

Still another object of the present invention is to provide a method for fabricating an LCD device capable of simplifying processes and reducing installation costs by using the color filter as a common electrode or a back electrode, or by forming the color filter on a lower array substrate together with a switching device.

To achieve these and other advantages and in accordance with the purpose of the present invention, as embodied and broadly described herein, there is provided a method for fabricating a color filter using a surface plasmon, the method comprising: forming a metallic film formed of a conductive material on a substrate; forming, on the metallic film, a dielectric layer formed of a dielectric material having a refractive index equal to or similar to that of the substrate; forming a predetermined photosensitive pattern on the substrate having the dielectric layer formed thereon; forming, below the predetermined photosensitive pattern, a dielectric pattern formed of the dielectric material, by selectively removing the dielectric layer by using the photosensitive pattern as a mask; forming, in a metal layer formed of the metallic film, a transmissive pattern consisting of a plurality of sub-wavelength holes having a period, by selectively removing the metal layer by using the photosensitive pattern as a mask; and forming, on the metal layer including the transmissive pattern, an insulating layer formed of the same material as the dielectric material.

To achieve these and other advantages and in accordance with the purpose of the present invention, as embodied and broadly described herein, there is also provided a method for fabricating a liquid crystal display (LCD) device, the method comprising: providing a first substrate and a second substrate; forming a metallic film formed of a conductive material on the first substrate; forming, on the metallic film, a dielectric layer formed of a dielectric material having a refractive index equal to or similar to that of the first substrate; forming a predetermined photosensitive pattern on the first substrate having the dielectric layer formed thereon; forming, below the predetermined photosensitive pattern, a dielectric pattern formed of the dielectric material, by selectively removing the dielectric layer by using the photosensitive pattern as a mask; forming, in a metal layer formed of the metallic film, a transmissive pattern consisting of a plurality of sub-wavelength holes having a period, by selectively removing the metal layer by using the photosensitive pattern as a mask; forming, on the metal layer including the transmissive pattern, an insulating layer formed of the same material as the dielectric material; forming a thin film transistor on the insulating layer; and bonding the first and second substrates to each other, wherein the second substrate has no color filter and black matrix formed thereon.

According to another aspect of the present invention, there is also provided a method for fabricating a liquid crystal display (LCD) device, the method comprising: providing a first substrate and a second substrate; forming a metallic film formed of a conductive material on an external surface of the first substrate; forming, on the metallic film, a dielectric layer formed of a dielectric material having a refractive index equal to or similar to that of the first substrate; forming a predetermined photosensitive pattern on the first substrate having the dielectric layer formed thereon; forming, below the predetermined photosensitive pattern, a dielectric pattern formed of the dielectric material, by selectively removing the dielectric layer by using the photosensitive pattern as a mask; forming, in a metal layer formed of the metallic layer, a transmissive pattern consisting of a plurality of sub-wavelength holes having a period, by selectively removing the metal layer by using the photosensitive pattern as a mask; forming, on the metal layer including the transmissive pattern, an insulating layer formed of the same material as the dielectric material; forming a thin film transistor on an inner surface of the first substrate; and bonding the first and second substrates to each other, wherein the second substrate has no color filter and black matrix formed thereon.

According to still another aspect of the present invention, there is also provided a method for fabricating a liquid crystal display (LCD) device, the method comprising: providing a first substrate and a second substrate; forming a thin film transistor on the first substrate; forming a metallic film formed of a conductive material on the second substrate; forming, on the metallic film, a dielectric layer formed of a dielectric material having a refractive index equal to or similar to that of the second substrate; forming a predetermined photosensitive pattern on the second substrate having the dielectric layer formed thereon; forming, below the predetermined photosensitive pattern, a dielectric pattern formed of the dielectric material, by selectively removing the dielectric layer by using the photosensitive pattern as a mask; forming, in a metal layer formed of the metallic film, a transmissive pattern consisting of a plurality of sub-wavelength holes having a period, by selectively removing the metal layer by using the photosensitive pattern as a mask; forming, on the metal layer including the transmissive pattern, an insulating layer formed of the same material as the dielectric material; and bonding the first and second substrates to each other.

The color filter may be formed to have a 3D pattern structure having a transmissive pattern consisting of a plurality of holes of different sizes, and capable of selectively transmitting light of only red, green and blue wavelengths.

The dielectric layer may be formed to have a thickness of 5 nm~1000 nm, and may be formed of $SiO_2$ in case of using a glass substrate as the substrate.

The metallic film may be formed of a conductive material including at least one selected from a group consisting of aluminum, gold, silver, platinum, copper, nickel, palladium, zinc, iron, chrome, molybdenum, a doped semiconductor device, carbon nanotube, fullerene, conductive plastic, and electrical conductive composite material, or a mixture thereof.

The photosensitive pattern may be formed by using one of an e-beam lithography, an ion beam milling, a nanosphere lithography, a nano imprinting, a photolithography, and a laser interference lithography.

The dielectric layer may be etched by a reactive ion etching method based on $CHF_3$.

The metallic film may be etched by a reactive ion etching method based on $Cl_2$.

The hole of the transmissive pattern may be formed in a sub-wavelength size having a predetermined period, and may have a circular shape, an oval shape, a quadrangular shape, a triangular shape, a slit shape, etc.

The insulating layer may be formed to have a thickness of 10 nm~1000 nm, and serves as an over coating layer.

The insulating layer may be formed by using one of a gas phase method, a liquid phase method, a solid phase method, and a nanosol coating method.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 8 is a sectional view schematically showing one structure of a liquid crystal display (LCD) device according to the present invention;

FIGS. 11A to 11F are sectional views sequentially showing processes for fabricating the LCD device of FIG. 9.

DETAILED DESCRIPTION OF THE INVENTION

Description will now be given in detail of embodiments of the present invention, with reference to the accompanying drawings.

For the sake of brief description with reference to the drawings, the same or equivalent components will be provided with the same reference numbers, and description thereof will not be repeated.

Hereinafter, methods for fabricating a color filter using a surface plasmon and a liquid crystal display (LCD) device according to the present invention will be explained in more detail with reference to the attached drawings.

The general method for enhancing a transmittance ratio of an LC panel by improving an aperture ratio of an array substrate has many limitations. Accordingly, the general paradigm has to be changed into a new paradigm for enhancing a transmittance ratio of an LC panel by removing a color filter.

For this, has been proposed a method for filtering light by forming a transmissive pattern at a metal layer so that light of a specific wavelength can be selectively transmitted. The present invention is to provide a color filter capable of transmitting RGB colors by forming a metal layer using a surface plasmon.

Figure 1:
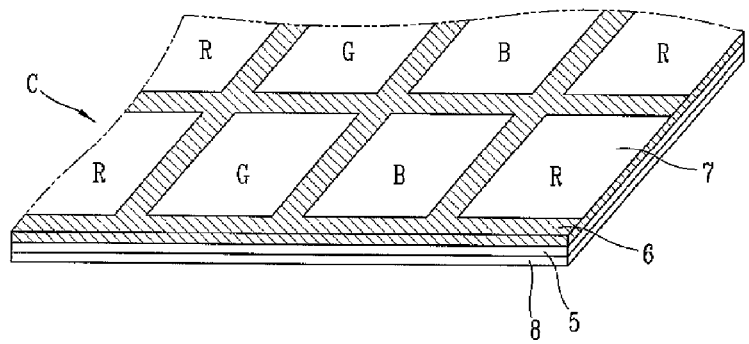
FIG. 1 is a disassembled perspective view schematically showing a structure of a liquid crystal display (LCD) device in accordance with the related art.
Figure 2:
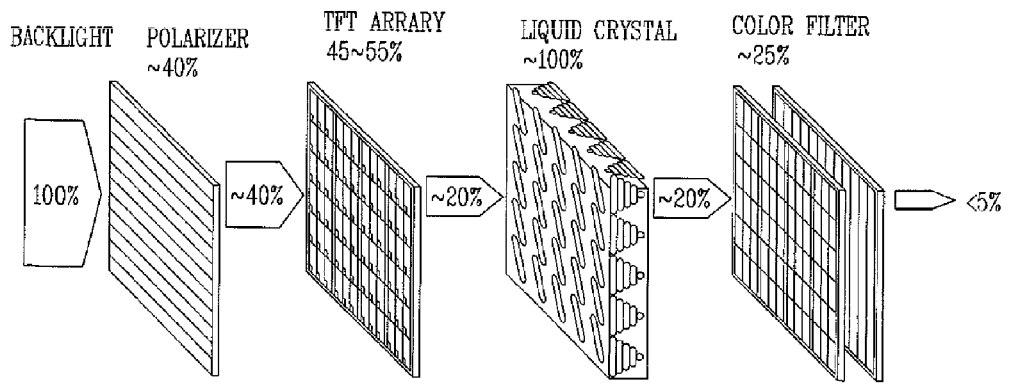
FIG. 2 is an exemplary view schematically showing a transmittance ratio of an LC panel when applying a color filter using a general pigment dispersing method.
Figure 3A:
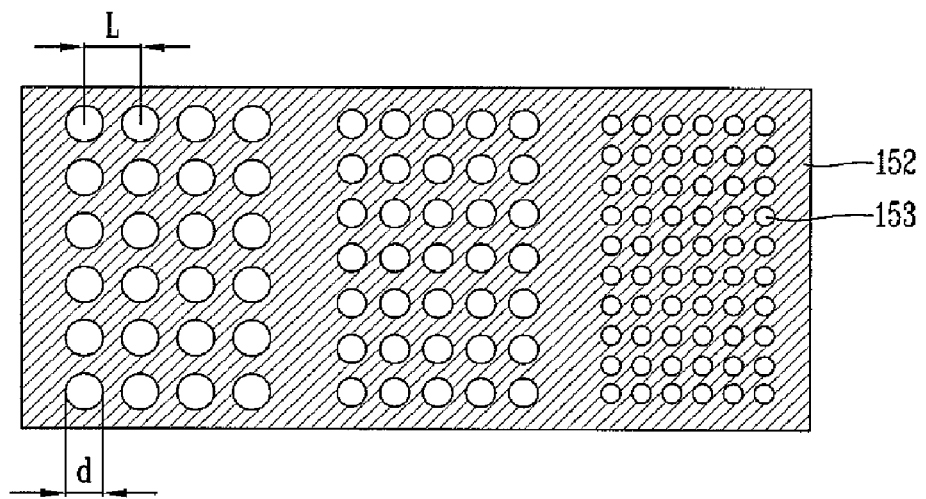
FIGS. 3A and 3B are respectively a planar view and a sectional view, which schematically show a structure of a color filter using a surface plasmon according to the present invention.
Figure 3B:
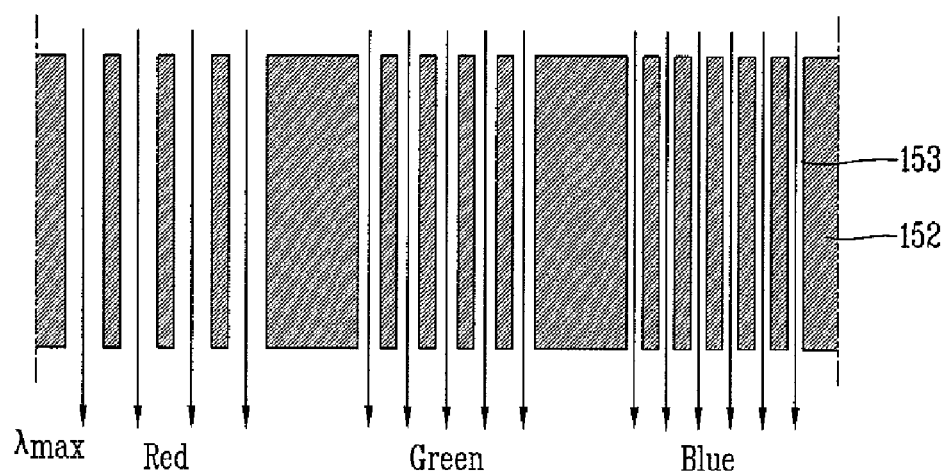

FIGS. 3A and 3B are respectively planar and sectional views schematically showing a structure of a color filter fabricated by using a surface plasmon phenomenon according to the present invention.

Referring to FIGS. 3A and 3B, a transmissive pattern 153 including of a plurality of sub-wavelength holes having a predetermined period (L) is formed in a metal layer 152. An electric field of incident light having both a wavelength of near infrared light and a wavelength of visible light is coupled to a plasmon. Accordingly, only light of specific wavelengths is transmitted, and light of other wavelengths is reflected, thereby obtaining RGB colors.

For instance, if a sub-wavelength hole pattern having a predetermined period (L) is formed on a silver film, selected RGB light of specific wavelengths is transmitted according to a size (d) and a period (L) of a hole, thereby implementing RGB colors. A greater amount of light than that of light illuminating on a hole area may be transmitted by absorbing light near the hole.

In order to implement a color of a high purity, each thickness of the metal layer 152 corresponding to each wavelength may be differently controlled. However, the present invention is not limited to this.

For reference, the plasmon refers to a quasiparticle that free electrons induced on a surface of metal oscillate collectively by an electric field of incident light. A surface plasmon indicates that the plasmon partially exists on the metal surface, which corresponds to an electromagnetic wave that proceeds along an interface between the metal and a dielectric.

The surface plasmon phenomenon refers to forming light of a specific wavelength as light of a specific wavelength incident onto a surface of metal having a nano-sized periodic hole pattern resonates with free electrons on the metal surface. Only light of specific wavelengths is made to transmit through the hole, and light of other wavelengths is made to be reflected from the metal surface.

Generally, a thick metal layer can not transmit incident light. If a hole formed at the metal layer has a size much smaller than a wavelength of incident light, an intensity of transmitted light is significantly decreased. However, if the sub-wavelength small holes are periodically arranged at the metal layer, a transmittance ratio of light is significantly increased due to excitation of a surface plasmon. Generally, a dispersion curve of light or photon does not cross a dispersion curve of a surface plasmon. In order to directly couple the photon to the surface plasmon, a grating structure of a hole pattern having a predetermined period is formed on the surface of the metal layer. This may satisfy the conservation of momentum, thereby causing the surface plasmon to be excited.

By controlling the transmissive pattern, i.e., a size and period of the hole and a thickness of the metal layer, etc., light of a desired wavelength may be transmitted. In case of a metal layer provided with a square structure with holes having a period of 'L', a prime peak wavelength of light perpendicularly incident onto the metal layer, i.e., a surface plasmon resonance wavelength may be obtained by the following Equation 1.

$$\lambda_{spp} = L\sqrt{\frac{\varepsilon_m \varepsilon_d}{\varepsilon_m + \varepsilon_d}}$$ [Equation 1]

Here, $\varepsilon_m$ indicates a dielectric constant of metal, and $\varepsilon_d$ indicates a dielectric constant of a dielectric material adjacent to the metal. That is, a peak wavelength of light transmitted by a surface plasmon may be controlled by changing a period of a transmissive pattern or by changing a dielectric material.

The transmissive pattern may have not only a circular shape such as a hole, but also various shapes such as an oval shape, a quadrangular shape, a triangular shape, and a slit shape. When the transmissive pattern has a circular shape, the hole has a diameter of 50 nm~100 μm and a period of 50 nm~100 μm. In case of using aluminum (Al) having a thickness of 150 nm as the metal layer, in order to transmit blue light of a wavelength of 450 nm, the hole has a period of about 272 nm and a size of about 136 nm. In order to transmit green light of a wavelength of 550 nm, the hole has a period of about 333 nm and a size of about 167 nm. And, in order to transmit red light of a wavelength of 650 nm, the hole has a period of about 394 nm and a size of about 197 nm.

Figure 4:
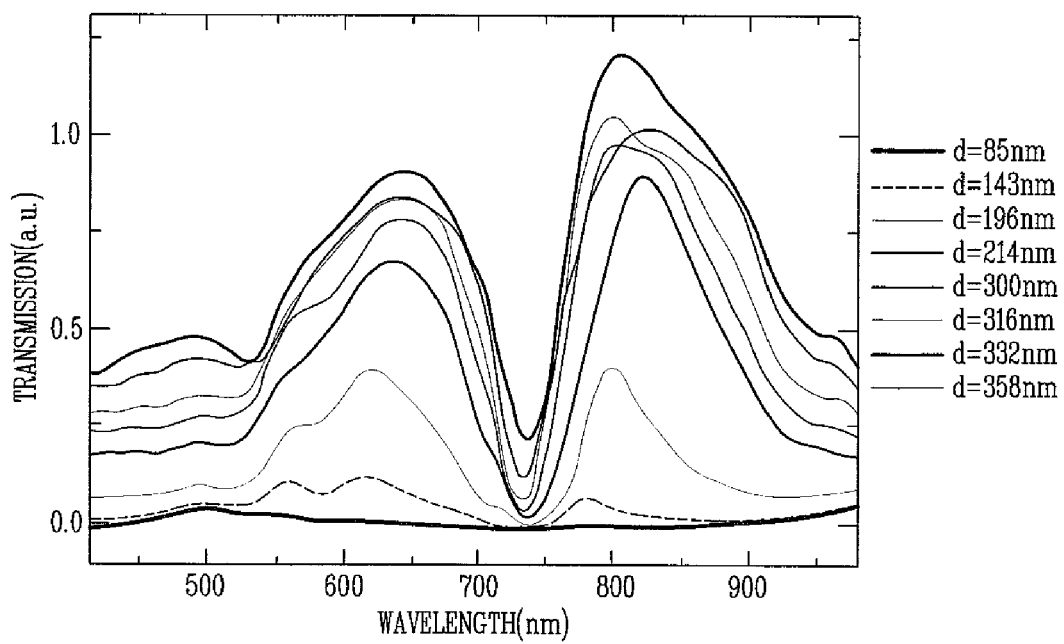
FIG. 4 is a graph showing multi-peaks of a transmission spectrum measured by changing a thickness (d) of a gold thin film in case of exposing the gold thin film formed on a glass substrate to the air.

When the metal layer of the color filter using a surface plasmon has a surface directly contacting the air, the surface of the metal layer is oxidized as time lapses. This may cause the surface of the metal layer to discolor and change the thickness of the pure metal layer, lowering a function of the color filter. Furthermore, as shown in FIG. 4, not only a prime peak but also other peaks occur at a transmission spectrum of visible light. This may greatly degrade a color purity. FIG. 4 is a graph showing multi-peaks measured at a transmission spectrum with changing a thickness (d) of a gold (Au) thin film exposed to the air within the range of 85 nm~358 nm (E. Laux, et al, Opt. Express, 6920, 2009).

Heterogeneous characteristics of dielectric materials near the metal layer may greatly degrade a color purity of transmitted light. More concretely, since a dielectric material on the metal layer, a material of the substrate, and other dielectric materials inside the holes have different refractive indexed from one another, the surface plasmon resonance wavelength ($\lambda_{spp}$) according to the Equation 1 is not single but plural. As other peaks rather than a desired prime peak wavelength additionally occur at a transmission spectrum of visible light, monochromaticity and a transmittance ratio of the color filter are degraded.

If a refractive index of the dielectric material which fills the transmissive pattern does not match a refractive index of the substrate, both a surface plasmon mode between the substrate and the metal layer, and a surface plasmon mode between the dielectric material and the metal layer occur. Accordingly, two peculiar peaks occur at a transmission spectrum. When the refractive index of the dielectric material is larger than that of the substrate, additional peaks occur at a long wavelength bandwidth. On the other hand, when the refractive index of the dielectric material is smaller than that of the substrate, additional peaks occur at a short wavelength bandwidth. However, if the dielectric materials near the metal layer undergo refractive index matching, one surface plasmon resonance is excited at a region of the metal layer. This may allow only one peak having excellent monochromaticity to occur at a transmission spectrum of visible light.

In the present invention, a dielectric material having a refractive index equal to or similar to that of the substrate is deposited on the metal layer, and then is patterned, thereby forming a transmissive pattern in the metal layer. And, the same material as the dielectric material is deposited on the color filter including the transmissive pattern. This may implement refractive index matching, and may prevent oxidation of the surface of the metal layer. Furthermore, since the dielectric material deposited on the color filter replaces an over coating layer, the entire processes may be simplified.

FIGS. 5A to 5E are sectional views sequentially showing processes for fabricating a color filter according to the present invention.

Figure 5A:
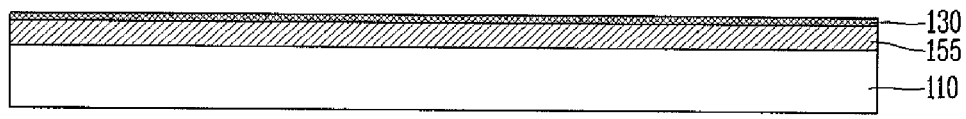
FIGS. 5A to 5E are sectional views sequentially showing processes for fabricating a color filter according to the present invention.

As shown in FIG. 5A, a metallic film 155 formed of a conductive material is formed on a substrate 110. Then, a dielectric layer 130 is formed on the metallic film 155 in a thickness of about 5 nm~1000 nm.

The metallic film 155 may be formed of a conductive material including at least one selected from a group consisting of aluminum (Al), gold (Au), silver (Ag), platinum (Pt), copper (Cu), nickel (Ni), palladium (Pd), zinc (Zn), iron (Fe), chrome (Cr), molybdenum (Mo), a doped semiconductor device, carbon nanotube, fullerene, conductive plastic, and electrical conductive composite material, or a mixture thereof.

The dielectric layer 130 may be formed of a dielectric material having a refractive index equal to or similar to that of the substrate 110. In case of using a glass substrate as the substrate 110, the dielectric layer 130 may be formed of silicon oxide ($SiO_2$).

Figure 5B:
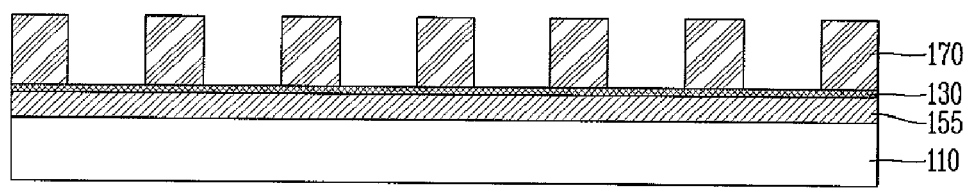

As shown in FIG. 5B, a photosensitive pattern 170 is formed on the substrate 110 having the dielectric layer 130 formed thereon. The photosensitive pattern 170 is configured to form a transmissive pattern having a plurality of sub-wavelength holes in the metallic film 155.

The photosensitive pattern 170 may be formed by using one of a direct beam writing lithography, an ion beam milling, a nanosphere lithography, a nano imprinting, a photolithography, and a laser interference lithography.

Figure 5C:
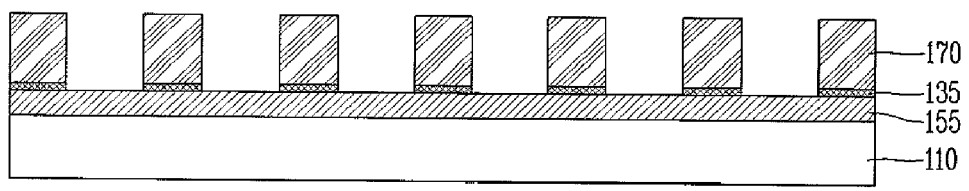

Then, the dielectric pattern 130 formed below the photosensitive pattern 170 is selectively removed by using the photosensitive pattern 170 as a mask. As a result, as shown in FIG. 5C, a dielectric pattern 135 formed of the dielectric material and patterned in the same shape as the photosensitive pattern 170 is formed below the photosensitive pattern 170.

The dielectric layer 130 may be etched by a Reactive Ion Etching (RIE) method based on $CHF_3$.

Figure 5D:
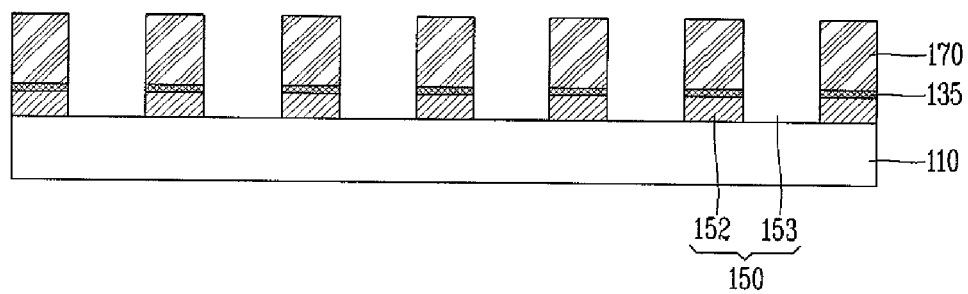

Then, the metallic film 152 disposed below the photosensitive pattern 170 is selectively removed by using the photosensitive pattern 170 as a mask. As a result, as shown in FIG. 5D, the metal layer 152 is patterned in the same shape as the dielectric pattern 135.

The metal layer 152 may be etched by a reactive ion etching method based on $Cl_2$.

As the transmissive pattern 153 consisting of a plurality of sub-wavelength holes having a period is formed in the metal layer 152, the color filter 150 for implementing colors by selectively transmitting light of a specific wavelength is fabricated.

The holes of the transmissive pattern 153 are formed in a sub-wavelength size having a predetermined period. And, the holes of the transmissive pattern 153 may be formed not only in a circular shape, but also in various shapes such as an oval shape, a quadrangular shape, a triangular shape, and a slit shape.

Figure 5E:
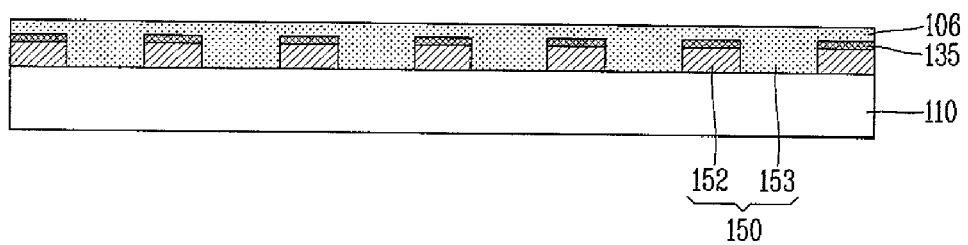

As shown in FIG. 5E, the photosensitive pattern is removed by an oxygen plasma ashing, and a dielectric material is deposited on the color filter 150 to form an insulating layer 106 in a thickness of about 10 nm~1000 nm.

The insulating layer 106 may be formed of the same material as the dielectric material of the dielectric pattern 135, and may be formed by using one of a gas phase method, a liquid phase method, a solid phase method, and a nanosol coating method.

The color filter using a surface plasmon according to the present invention may have one surface plasmon resonance thereon as conditions for refractive index matching are satisfied, and may maximize a transmittance ratio and monochromaticity at a specific wavelength bandwidth. Furthermore, a dielectric material having a refractive index equal to or similar to that of the substrate is deposited on the metallic film, and then the metal layer is patterned, thereby preventing oxidation of the surface of the metal layer which may occur during the fabrication processes.

Furthermore, in the color filter using a surface plasmon according to the present invention, the transmissive pattern is filled with a dielectric material having a refractive index equal to or similar to that of the substrate. This may prevent a total internal reflection of light incident into the holes of the transmissive pattern. Accordingly, decrease of a transmittance ratio due to a total internal reflection may be prevented.

Figure 6A:
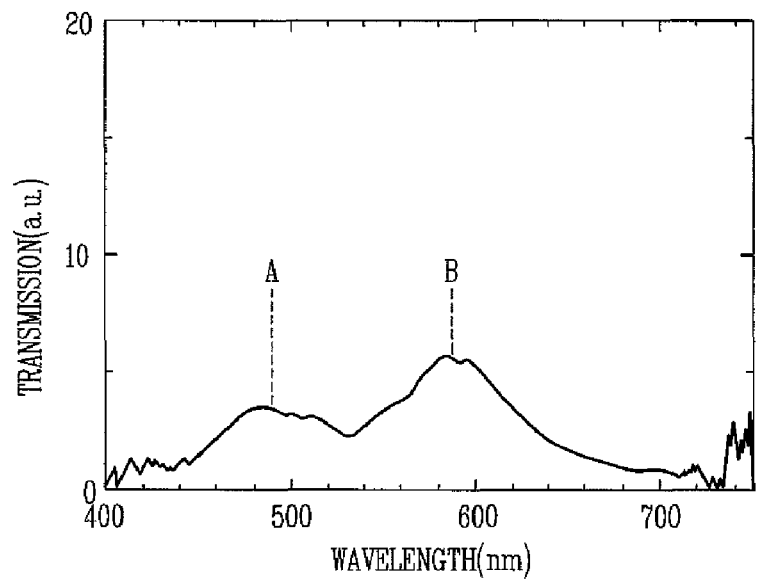
FIGS. 6A and 6B are graphs showing a transmission spectrum of a color filter using a surface plasmon when refractive index matching has not been performed and has been performed, respectively.
Figure 6B:
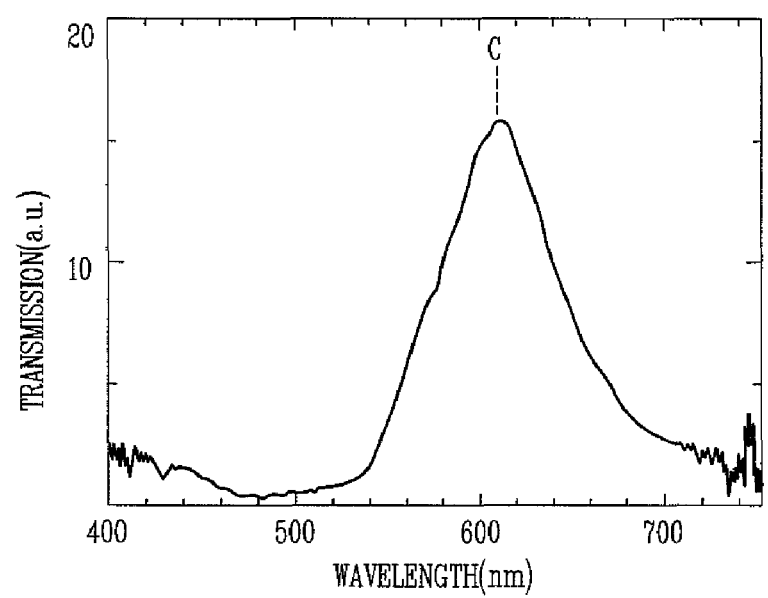

FIGS. 6A and 6B are graphs showing a transmission spectrum of a color filter using a surface plasmon when refractive index matching has not been performed and has been performed.

As shown in FIG. 6A, if a refractive index of the dielectric material does not match a refractive index of the substrate, two surface plasmon resonances occur to decrease a transmittance ratio. As both a surface plasmon mode (A) between the substrate and the metal layer, and a surface plasmon mode (B) between the dielectric material and the metal layer occur. Accordingly, two peculiar peaks occur at a transmission spectrum.

When the refractive index of the dielectric material is larger than that of the substrate, additional peaks occur at a long wavelength bandwidth. On the other hand, when the refractive index of the dielectric material is smaller than that of the substrate, additional peaks occur at a short wavelength bandwidth.

As shown in FIG. 6B, if refractive index matching among the dielectric materials near the metal layer has been performed, one surface plasmon resonance (C) occurs. This may increase a color purity and a transmittance ratio, and may cause a red shift of a central wavelength (~30 nm).

Figure 7A:
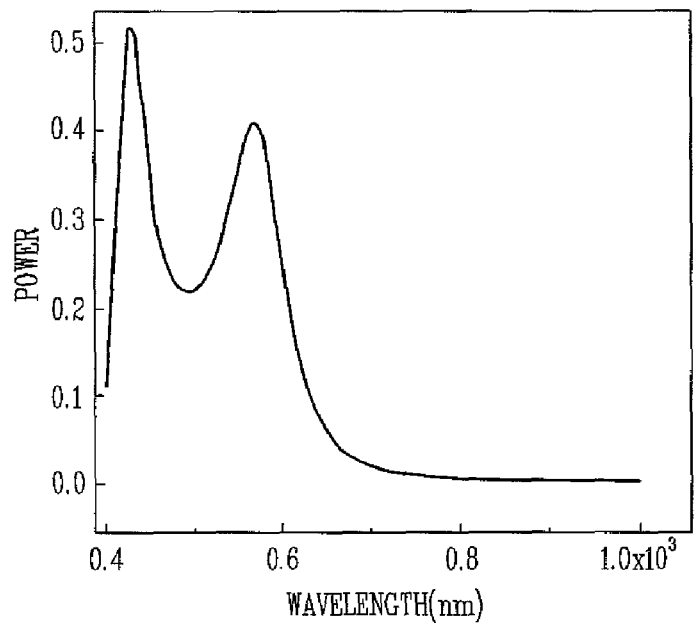
FIGS. 7A and 7B are graphs showing a transmission spectrum of a red sub-color filter using a surface plasmon when refractive index matching has not been performed and has been performed, respectively.
Figure 7B:
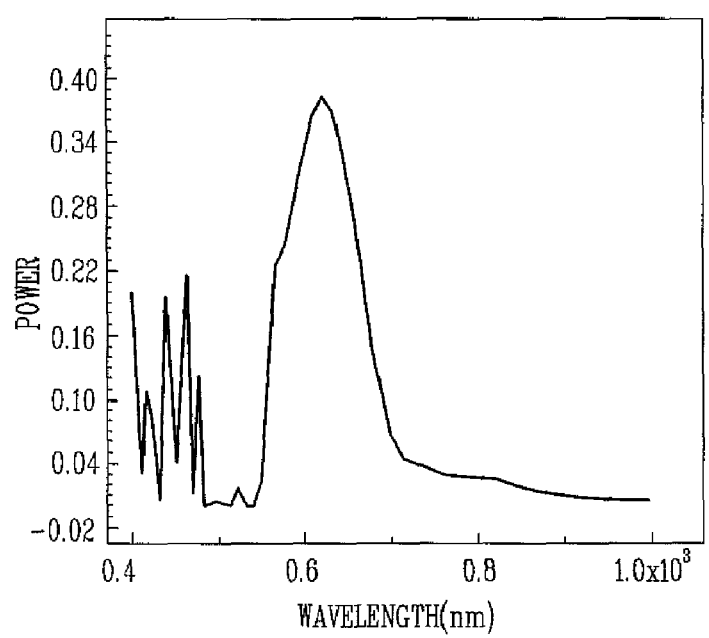

FIGS. 7A and 7B are graphs showing a transmission spectrum of a red sub-color filter using a surface plasmon when refractive index matching has not been performed and has been performed, which show simulation results of a Finite Difference Time Domain (FDTD) with respect to a red sub-color filter.

More concretely, FIGS. 7A and 7B show a transmission spectrum of a red sub-color filter having a transmissive pattern implemented as a plurality of holes having a diameter of 210 nm are formed with a period of 420 nm in a metal layer formed of 150 nm thick aluminum.

Referring to FIG. 7A, dual peaks occur at a wavelength of 600 nm or less than when refractive index matching has not been performed. This may result from a peak by a surface plasmon mode between the substrate and the aluminum, and a peak by a surface plasmon mode between the air and the aluminum.

Referring to FIG. 7B, no dominant peak occurs at a wavelength of 480 nm or less than when refractive index matching has been performed among the dielectric materials near the metal layer. As a result, one red peak occurs.

The transmissive pattern consisting of a plurality of holes having a specific period and size is formed in the metal layer. The metal layer is used as a color filter by using a surface plasmon occurring therefrom, and the color filter is applied to an LCD device to implement colors.

The general color filter is formed on an upper substrate, a color filter substrate. However, the color filter using a surface plasmon according to the present invention may be formed on a lower array substrate, or outside the lower array substrate.

More concretely, the general color filter using pigments or dyes can not undergo a high temperature process. On the other hand, the color filter using a surface plasmon according to the present invention may undergo a high temperature process, because the metal layer serves as the color filter. This may allow a thin film transistor to be fabricated on the metal layer through the high temperature process. Furthermore, since the color filter is formed at the lower array substrate, can be solved the general problem, decrease of an aperture ratio occurring as an alignment margin is obtained when bonding the upper and lower substrates to each other.

Figure 9:
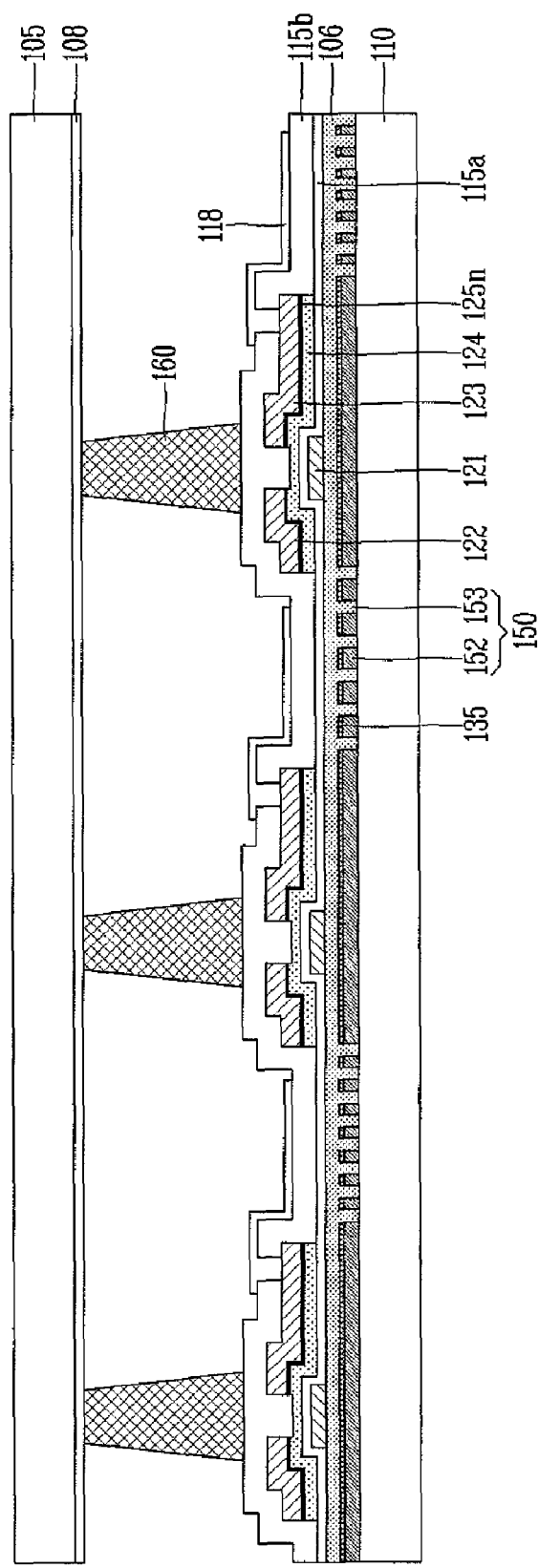
FIG. 9 is a sectional view schematically showing another structure of the liquid crystal display (LCD) device according to the present invention.

FIGS. 8 and 9 are sectional views schematically showing structures of a liquid crystal display (LCD) device according to the present invention. For convenience, the same components are provided with the same reference numeral.

In order to apply the color filter using a surface plasmon to an LCD device, as shown in FIG. 8, the color filter 150 according to the present invention is formed on an upper color filter substrate 105.

This is advantageous in that a transmissive pattern is formed on a single metal layer by one step process thus to implement RGB colors. And, the transmissive pattern is used instead of an upper common electrode or a back ITO electrode, thereby simplifying the entire processes and reducing the fabrication costs.

As aforementioned, the color filter 150 using a surface plasmon is advantageous to a color purity and a transmittance ratio when refractive index matching has been performed among the dielectric materials near the metal layer 152. Accordingly, in case of forming the color filter 150 on a glass substrate, the insulating layer 106 formed of the same material as the glass substrate, such as $SiO_2$, is preferably formed on the metal layer 152 including the transmissive pattern 153. Especially, the color filter 150 using a surface plasmon according to the present invention may prevent oxidation of the surface of the metal layer 152 by depositing, on the metal layer 152, a dielectric material having a refractive index equal to or similar to that of the substrate, and then by patterning the metal layer 152.

The color filter substrate 105 is bonded to the array substrate 110 with facing each other, by a sealant (not shown) formed on an outer periphery of an image display region, in a state that a constant cell gap is maintained therebetween by a column spacer 160. The array substrate 110 consists of a plurality of gate lines (not shown) and data lines (not shown) arranged in horizontal and vertical directions to define a plurality of pixel regions, Thin Film Transistors (TFT), switching devices formed at intersections between the gate lines and the data lines, and pixel electrodes 118 formed in the pixel regions.

The TFT consists of a gate electrode 121 connected to the gate line, a source electrode 122 connected to the data line, and a drain electrode 123 connected to the pixel electrode 118. The TFT further includes a first insulating layer 115a for insulating the gate electrode 121 and the source/drain electrodes 122 and 123 from each other, and an active pattern 124 for forming a conductive channel between the source electrode 122 and the drain electrode 123 by a gate voltage applied to the gate electrode 121. Reference numeral 115b indicates a second insulating layer, and reference numeral 125n indicates an ohmic-contact layer for ohmic-contacting between source/drain regions of the active pattern 124 and the source/drain electrodes 122 and 123.

The color filter using a surface plasmon is not damaged during a high temperature process since the metallic film is used. With considering this, the color filter may be formed on the array substrate.

As shown in FIG. 9, the color filter 150 using a surface plasmon may be formed inside a cell, i.e., below a TFT array. Although not shown, the color filter 150 may be also formed outside the cell, i.e., on an outer surface of the array substrate 110.

A common electrode 108 except for a color filter and a black matrix may be formed on the color filter substrate 105. The color filter 150 formed on the array substrate 110 may be floated or grounded.

In case of forming the color filter 150 on the array substrate 110, a margin for aligning the color filter substrate 105 and the array substrate 110 is not required. This may allow an aperture ratio to be increased at the time of designing an LC panel, thereby enhancing a transmittance ratio of the LC panel. If the transmittance ratio of the LC panel is enhanced, brightness of a backlight may be decreased to reduce power consumption by the backlight.

As the power consumption by the backlight is reduced, multi color pixels can be implemented to obtain a high picture quality with real color reproduction.

In case of forming the color filter 150 on the array substrate 110 and removing color filter processing lines, the installation costs may be reduced by about 50%.

Hereinafter, a structure of an LCD device in case of forming the color filter using a surface plasmon on the array substrate, and a method for fabricating the same will be explained in more detail with reference to the attached drawings.

Figure 10:
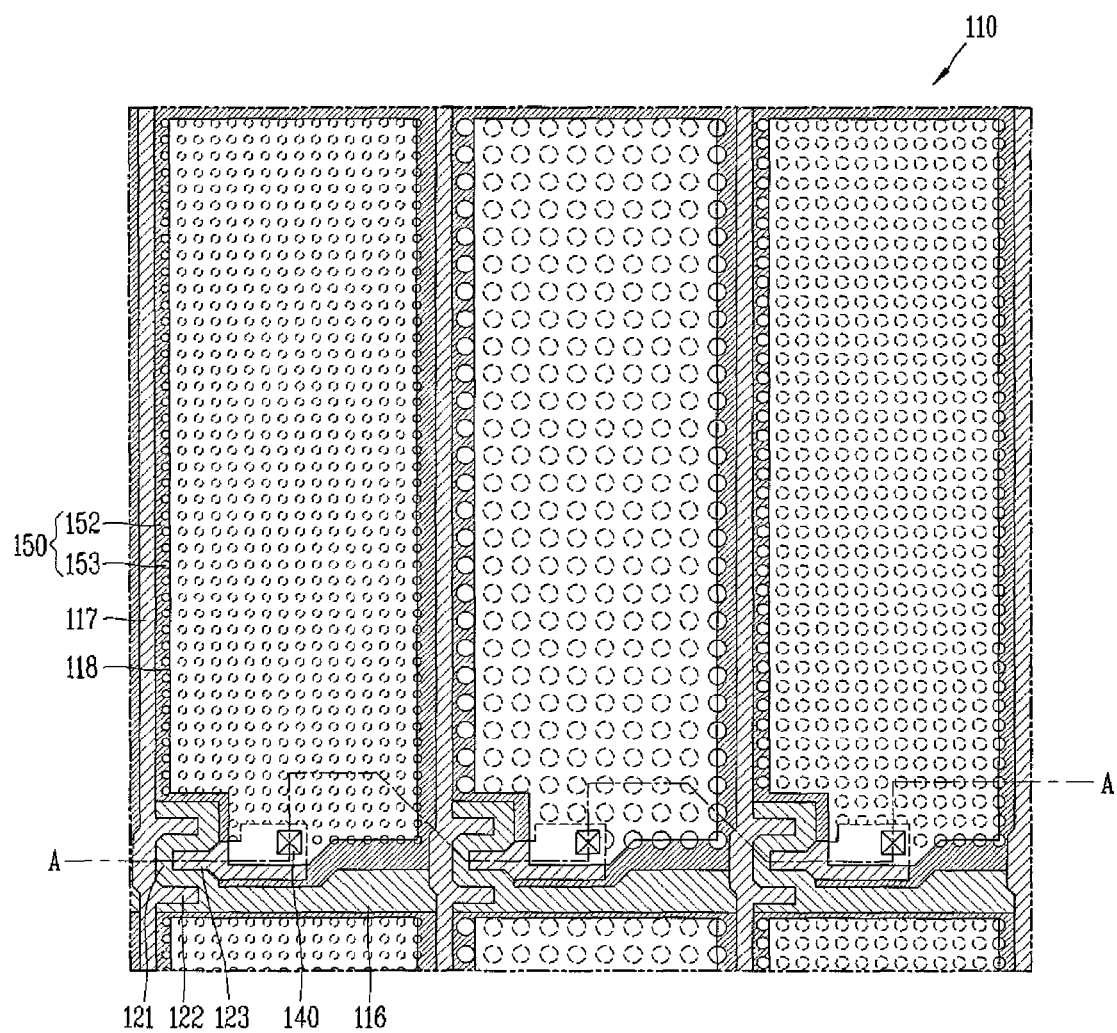
FIG. 10 is a planar view schematically showing a part of an array substrate of the LCD device according to the present invention.

FIG. 10 is a planar view schematically showing a part of the array substrate of the LCD device according to the present invention.

FIG. 10 shows one pixel composed of sub-color filters corresponding to blue, red and green colors from the left side. However, the present invention is not limited to this. That is, the present invention may be also applied to implement multi-colors more than three colors.

The sub-color filters corresponding to blue, red and green colors consist of the same components except for a structure of the color filter, i.e., a hole size and a period of the transmissive pattern.

The LCD device according to the present invention is a Twisted Nematic (TN) LCD device for driving nematic liquid crystal molecules in a direction perpendicular to a substrate. However, the present invention is not limited to this.

The array substrate 110 consists of a plurality of gate lines 116 and data lines 117 arranged in horizontal and vertical directions thereon to define a plurality of pixel regions. A thin film transistor (TFT), a switching device is formed at an intersection between the gate line 116 and the data line 117, and a pixel electrode 118 for driving an LC layer together with the common electrode 108 by being connected to the TFT is formed in the pixel region.

The TFT consists of a gate electrode 121 constituting a part of the gate line 116, a source electrode 122 connected to the data line 117, and a drain electrode 123 connected to the pixel electrode 118. The TFT further includes a first insulating layer (not shown) for insulating the gate electrode 121 and the source/drain electrodes 122 and 123 from each other, and an active pattern (not shown) for forming a conductive channel between the source electrode 122 and the drain electrode 123 by a gate voltage applied to the gate electrode 121.

A part of the source electrode 122 is extending towards one direction to constitute a part of the data line 117. And, a part of the drain electrode 123 is extending towards the pixel region to be electrically connected to the pixel electrode 118 through a contact hole 140 of a second insulating layer (not shown).

The color filter 150 using a surface plasmon is disposed on the array substrate 110. The color filter 150 is composed of the transmissive pattern 153 formed in the metal layer 152 and consisting of a plurality of sub-wavelength holes having a predetermined period. An electric field of incident light having both a wavelength of near infrared light and a wavelength of visible light is coupled to a plasmon. Accordingly, only light of specific wavelengths is transmitted, and light of other wavelengths is reflected, thereby obtaining RGB colors.

The transmissive pattern 153 is formed in the pixel region except for a region where the gate line 116, the data line 117 and the TFT are formed.

In case of using aluminum having a thickness of 150 nm as the metal layer of the color filter 150 using a surface plamson, in order to transmit blue light of a wavelength of 450 nm, the hole has a period of about 272 nm and a size of about 136 nm. In order to transmit green light of a wavelength of 550 nm, the hole has a period of about 333 nm and a size of about 167 nm. And, in order to transmit red light of a wavelength of 650 nm, the hole has a period of about 394 nm and a size of about 197 nm.

FIGS. 11A to 11F are sectional views sequentially showing processes for fabricating the LCD device of FIG. 9, and FIGS. 12A to 12E are planar views sequentially showing processes for fabricating the array substrate of FIG. 10.

Figure 11F:
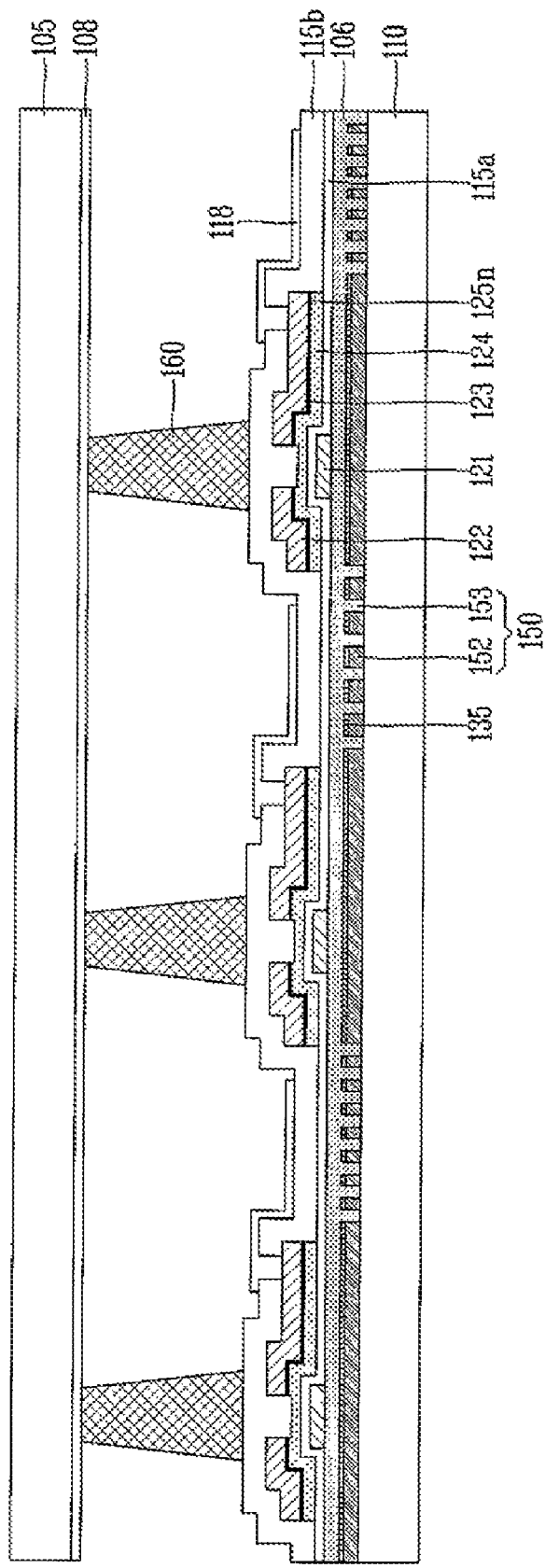
Figure 12A:
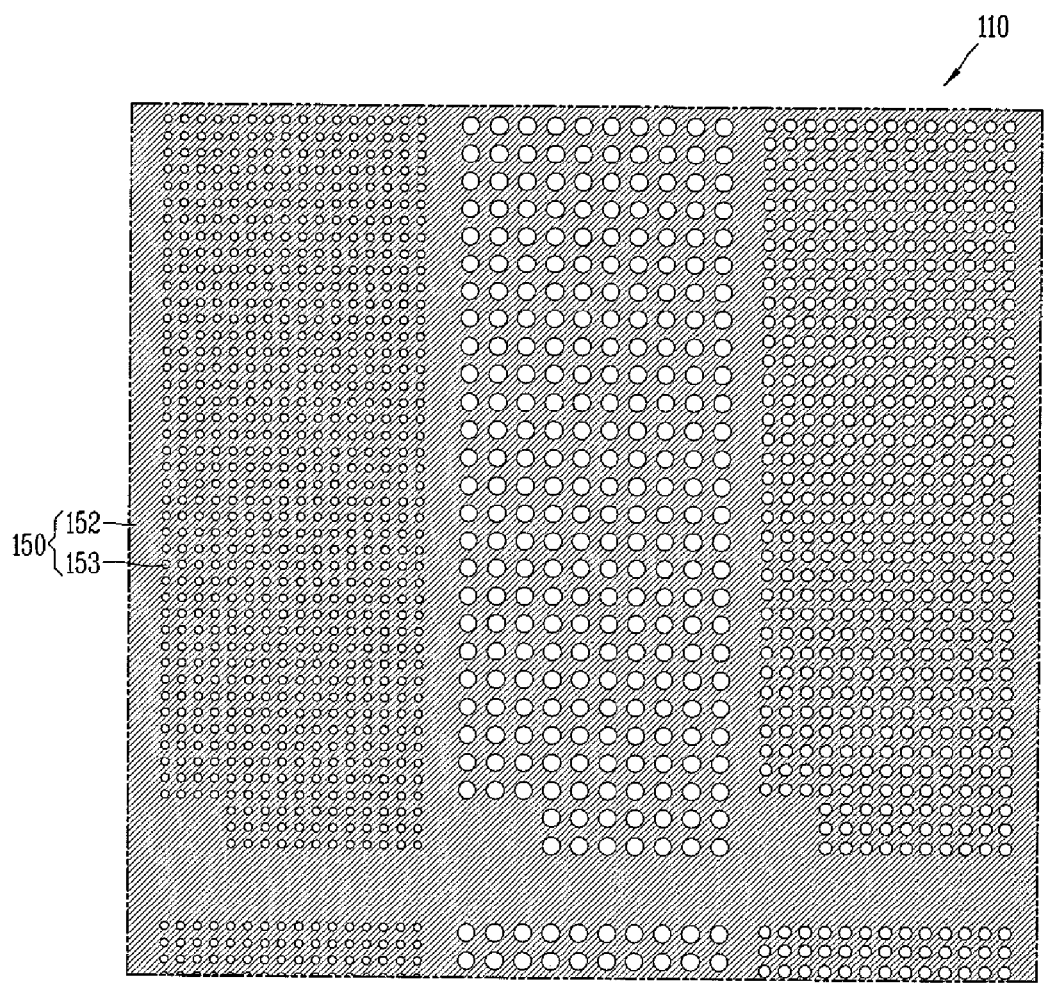
FIGS. 12A to 12E are planar views sequentially showing processes for fabricating the array substrate of FIG. 10.

As shown in FIGS. 11A and 12A, the color filter 150 using a surface plasmon according to the present invention is formed on the array substrate 110 formed of a transparent insulating material such as glass.

The color filter 150 is composed of the transmissive pattern 153 formed in the metal layer 152 and consisting of a plurality of sub-wavelength holes having a predetermined period. An electric field of incident light having both a wavelength of near infrared light and a wavelength of visible light is coupled to a plasmon. Accordingly, only light of specific wavelengths is transmitted, and light of other wavelengths is reflected, thereby obtaining RGB colors.

The hole of the transmissive pattern 153 may be formed in a sub-wavelength size having a predetermined period, and may have not only a circular shape, but also an oval shape, a quadrangular shape, a triangular shape, a slit shape, etc.

The metal layer 152 may be formed of a conductive material including at least one selected from a group consisting of aluminum, gold, silver, platinum, copper, nickel, palladium, zinc, iron, chrome, molybdenum, a doped semiconductor device, carbon nanotube, fullerene, conductive plastic, and electrical conductive composite material, or a mixture thereof.

A dielectric pattern 135 formed of a dielectric material having a refractive index equal to or similar to that of the array substrate 110 is formed on the metal layer 152. This may prevent oxidation of the surface of the metal layer 152 during the fabrication processes.

Then, the same material as the dielectric material is deposited above the metal layer 152 including the transmissive pattern 153, thereby forming an insulating layer 106 for planarizing the surface of the color filter 150.

The color filter 150 implements RGB colors as the transmissive pattern 153 consisting of a plurality of sub-wavelength holes having a constant period is formed in the metal layer 152.

The color filter 150 according to the present invention implements RGB colors by selectively transmitting a blue color through a blue color transmissive pattern inside a blue color region, by selectively transmitting a red color through a red color transmissive pattern inside a red color region, and by selectively transmitting a green color through a green color transmissive pattern inside a green color region.

Figure 12B:
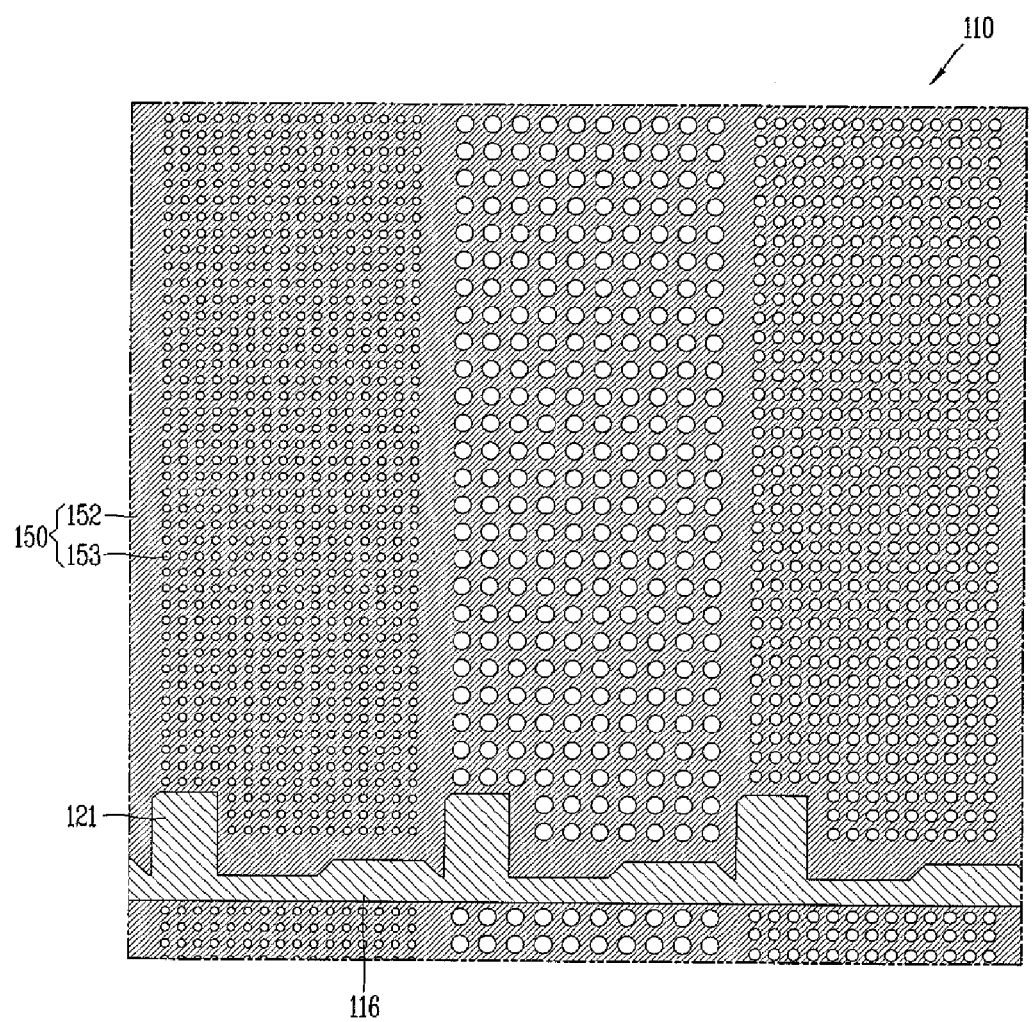

As shown in FIGS. 11B and 12B, a gate electrode 121 and a gate line 116 are formed on the array substrate 110 having the insulating layer formed thereon.

Here, the gate electrode 121 and the gate line 116 are formed by depositing a first conductive film on the entire surface of the array substrate 110, and then by selectively patterning the first conductive film by a photolithography process.

The first conductive film may be formed of an opaque conductive material having a low resistance, such as aluminum (Al), Al alloy, tungsten (W), copper (Cu), chromium (Cr), molybdenum (Mo), and Mo alloy. Alternatively, the first conductive film may be formed to have a multi-structure implemented as at least two of the above materials are laminated on each other.

Figure 12C:
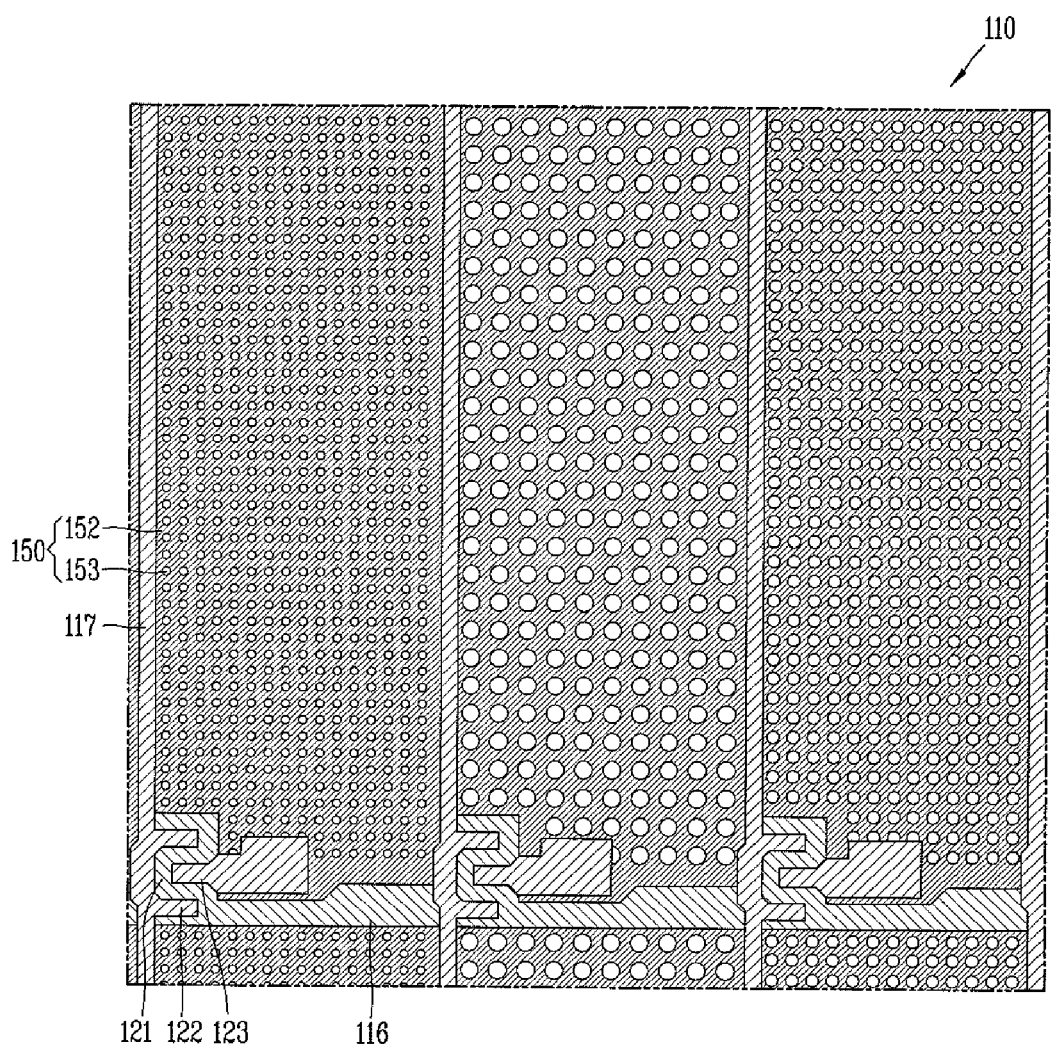

As shown in FIGS. 11C and 12C, on the entire surface of the array substrate 110 having the gate electrode 121 and the gate line 116 formed thereon, a first insulating layer 115a, an amorphous silicon thin film, an n+ amorphous silicon thin film, and a second conductive film are deposited, and then are selectively removed by a photolithography process. As a result, on the array substrate 110, formed are an active pattern 124 formed of the amorphous silicon thin film, and source/ drain electrodes 122 and 123 formed of the second conductive film and electrically connected to source/drain regions of the active pattern 124.

A data line 117 formed of the second conductive film and crossing the gate line to define a pixel region is formed by the photolithography process.

An ohmic contact layer 125n formed of the n+ amorphous silicon thin film and patterned in the same shape as the source/drain electrodes 122 and 123 is formed above the active pattern 124.

An amorphous silicon thin film pattern (not shown) and an n+ amorphous silicon thin film pattern (not shown), each formed of the amorphous silicon thin film and the n+ amorphous silicon thin film, respectively, and each patterned in the same shape as the data line 117 are formed below the data line 117.

The active pattern 124, the source/drain electrodes 122 and 123, and the data line 117 may be simultaneously formed by a single mask process using a half-tone mask or a diffraction mask.

The second conductive film may be formed of an opaque conductive material having a low resistance, such as aluminum (Al), Al alloy, tungsten (W), copper (Cu), chromium (Cr), molybdenum (Mo), and Mo alloy, so as to constitute the source/drain electrodes 122 and 123 and the data line 117. Alternatively, the second conductive film may be formed to have a multi-structure implemented as at least two of the above materials are laminated on each other.

Figure 12D:
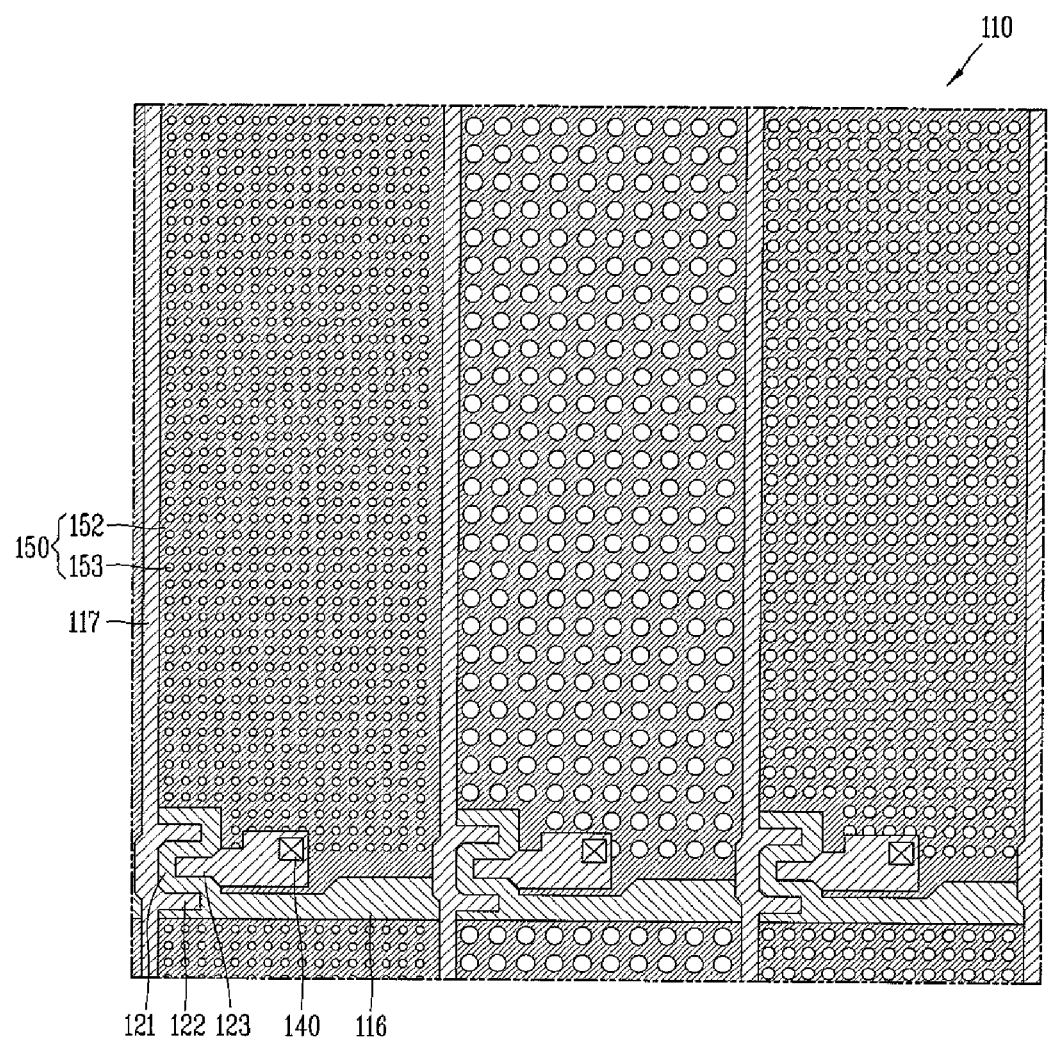

As shown in FIGS. 11D and 12D, a second insulating layer 115b is formed on the entire surface of the array substrate 110 having the active pattern 124, the source/drain electrodes 122 and 123, and the data line 117 formed thereon. Then, the second insulating layer 115b is selectively removed by a photolithography process, thereby forming, on the array substrate 110, a contact hole 140 exposing a part of the drain electrode 123.

The second insulating layer 115b may be formed of an inorganic insulating layer such as silicon nitride or silicon oxide, or may be formed of an organic insulating layer such as photoacryl or benzocyclobutene (BCB).

Figure 12E:
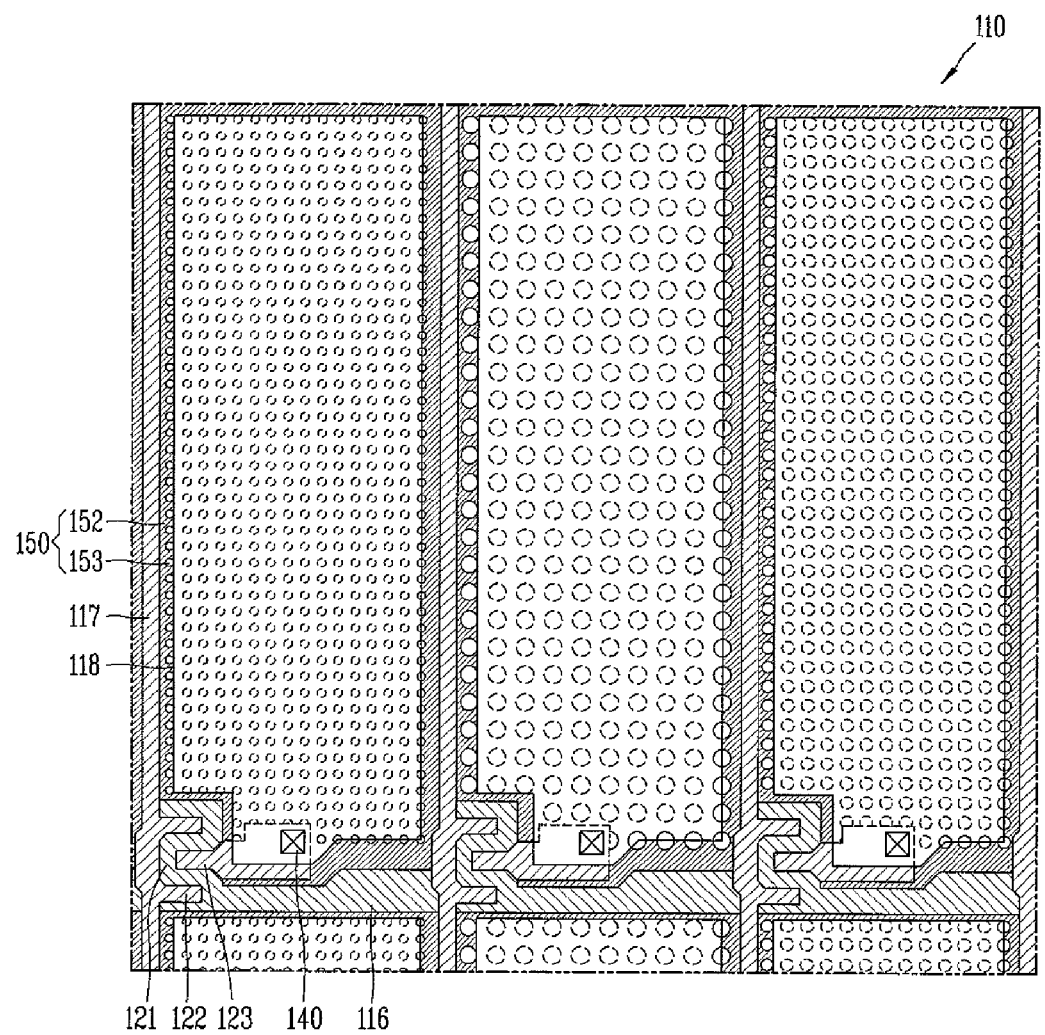

As shown in FIGS. 11E and 12E, a third conductive film is formed on the entire surface of the array substrate 110 having the second insulating layer 115b formed thereon, and then is selectively removed by a photolithography process. As a result, formed is a pixel electrode 118 electrically connected to the drain electrode 123 through the contact hole 140.

Here, the third conductive film includes a transparent conductive material having a high transmittance ratio, such as Indium Tin Oxide (ITO) or Indium Zinc Oxide (IZO) so as to constitute the pixel electrode.

As shown in FIG. 11F, the array substrate 110 according to the present invention is bonded to the color filter substrate 105 with facing each other, by a sealant (not shown) formed on an outer periphery of an image display region, in a state that a constant cell gap is maintained therebetween by a column spacer 160.

A common electrode 108 rather than a color filter and a black matrix may be formed on the color filter substrate 105.

In the preferred embodiment, it was explained that the present invention was applied to an amorphous silicon thin film transistor using an amorphous silicon thin film as an active pattern. However, the present invention is not limited to this. That is, the present invention may be also applied to a polycrystalline silicon thin film transistor using a polycrystalline silicon thin film as an active pattern, and an oxide thin film transistor using an oxide semiconductor device as an active layer.

The present invention may be applied not only to an LCD device, but also to other display devices fabricated by using thin film transistors, e.g., an OLED display device in which Organic Light Emitting Diodes (OLED) are connected to driving transistors.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A method for fabricating a color filter using a surface plasmon, the method comprising:
    forming a metallic film formed of a conductive material on a substrate;
    forming, on the metallic film, a dielectric layer formed of a dielectric material having a refractive index equal to or similar to that of the substrate;
    forming a predetermined photosensitive pattern on the substrate having the dielectric layer formed thereon;
    forming, below the predetermined photosensitive pattern, a dielectric pattern formed of the dielectric material, by selectively removing the dielectric layer by using the photosensitive pattern as a mask;
    forming, in a metal layer formed of the metallic film, a transmissive pattern consisting of a plurality of sub-wavelength holes having a period, by selectively removing the metal layer by using the photosensitive pattern as a mask; and
    forming, on the metal layer including the transmissive pattern, an insulating layer formed of the same material as the dielectric material.

2. The method of claim 1, wherein the dielectric layer is formed in a thickness of 5 nm~1000 nm.

3. The method of claim 1, wherein the metallic film is formed of a conductive material including at least one selected from a group consisting of aluminum, gold (Au), silver (Ag), platinum (Pt), copper (Cu), nickel (Ni), palladium (Pd), zinc (Zn), iron (Fe), chrome (Cr), molybdenum (Mo), a doped semiconductor device, carbon nanotube, fullerene, conductive plastic, and electrical conductive composite material, or a mixture thereof.

4. The method of claim 1, wherein the dielectric layer is formed of silicon oxide ($SiO_2$) in case of using a glass substrate as the substrate.

5. The method of claim 1, wherein the photosensitive pattern is formed by using one of a direct beam writing lithography, an ion beam milling, a nanosphere lithography, a nano imprinting, a photolithography, and a laser interference lithography.

6. The method of claim 1, wherein the dielectric layer is etched by a reactive ion etching (RIE) method based on $CHF_3$.

7. The method of claim 1, wherein the metallic film is etched by a reactive ion etching method based on $Cl_2$.

8. The method of claim 1, wherein the hole of the transmissive pattern is formed in a sub-wavelength size having a predetermined period, and has various shapes including a circular shape, an oval shape, a quadrangular shape, a triangular shape, and a slit shape.

9. The method of claim 1, wherein the insulating layer is formed to have a thickness of 10 nm~1000 nm.

10. The method of claim 1, wherein the insulating layer is formed by using one of a gas phase method, a liquid phase method, a solid phase method, and a nanosol coating method.

11. A method for fabricating a liquid crystal display (LCD) device, the method comprising:
   providing a first substrate and a second substrate;
   forming a metallic film formed of a conductive material on the first substrate;
   forming, on the metallic film, a dielectric layer formed of a dielectric material having a refractive index equal to or similar to that of the first substrate;
   forming a predetermined photosensitive pattern on the first substrate having the dielectric layer formed thereon;
   forming, below the predetermined photosensitive pattern, a dielectric pattern formed of the dielectric material, by selectively removing the dielectric layer by using the photosensitive pattern as a mask;
   forming, in a metal layer formed of the metallic film, a transmissive pattern consisting of a plurality of sub-wavelength holes having a period, by selectively removing the metal layer by using the photosensitive pattern as a mask;
   forming, on the metal layer including the transmissive pattern, an insulating layer formed of the same material as the dielectric material;
   forming a thin film transistor on the insulating layer; and
   bonding the first and second substrates to each other,
   wherein the second substrate has no color filter and black matrix formed thereon.

12. A method for fabricating a liquid crystal display (LCD) device, the method comprising:
   providing a first substrate and a second substrate;
   forming a metallic film formed of a conductive material on an external surface of the first substrate;
   forming, on the metallic film, a dielectric layer formed of a dielectric material having a refractive index equal to or similar to that of the first substrate;
   forming a predetermined photosensitive pattern on the first substrate having the dielectric layer formed thereon;
   forming, below the predetermined photosensitive pattern, a dielectric pattern formed of the dielectric material, by selectively removing the dielectric layer by using the photosensitive pattern as a mask;
   forming, in a metal layer formed of the metallic layer, a transmissive pattern consisting of a plurality of sub-wavelength holes having a period, by selectively removing the metal layer by using the photosensitive pattern as a mask;
   forming, on the metal layer including the transmissive pattern, an insulating layer formed of the same material as the dielectric material;
   forming a thin film transistor on an inner surface of the first substrate; and
   bonding the first and second substrates to each other,
   wherein the second substrate has no color filter and black matrix formed thereon.

13. A method for fabricating a liquid crystal display (LCD) device, the method comprising:
   providing a first substrate and a second substrate;
   forming a thin film transistor on the first substrate;
   forming a metallic film formed of a conductive material on the second substrate;
   forming, on the metallic film, a dielectric layer formed of a dielectric material having a refractive index equal to or similar to that of the second substrate;
   forming a predetermined photosensitive pattern on the second substrate having the dielectric layer formed thereon;
   forming, below the predetermined photosensitive pattern, a dielectric pattern formed of the dielectric material, by selectively removing the dielectric layer by using the photosensitive pattern as a mask;
   forming, in a metal layer formed of the metallic film, a transmissive pattern consisting of a plurality of sub-wavelength holes having a period, by selectively removing the metal layer by using the photosensitive pattern as a mask;
   forming, on the metal layer including the transmissive pattern, an insulating layer formed of the same material as the dielectric material; and
   bonding the first and second substrates to each other.

14. The method of claim 11, further comprising forming a common electrode or a back ITO electrode on the second substrate.

15. The method of claim 11, wherein the color filter is formed to have a 3D pattern structure having a transmissive pattern consisting of a plurality of holes of different sizes, and capable of selectively transmitting light of only red, green and blue wavelengths.

16. The method of claim 11, wherein the dielectric layer is formed to have a thickness of 5 nm~1000 nm.

17. The method of claim 11, wherein the metallic film is formed of a conductive material including at least one selected from a group consisting of aluminum, gold, silver, platinum, copper, nickel, palladium, zinc, iron, chrome, molybdenum, a doped semiconductor device, carbon nanotube, fullerene, conductive plastic, and electrical conductive composite material, or a mixture thereof.

18. The method of claim 11, wherein the dielectric layer is formed of silicon oxide ($SiO_2$) in case of using a glass substrate as the substrate.

19. The method of claim 11, wherein the photosensitive pattern is formed by using one of an e-beam lithography, an ion beam milling, a nanosphere lithography, a nano imprinting, a photolithography, and a laser interference lithography.

20. The method of claim 11, wherein the dielectric layer is etched by a reactive ion etching method based on $CHF_3$.

21. The method of claim 11, wherein the metallic film is etched by a reactive ion etching method based on $Cl_2$.

22. The method of claim 11, wherein the hole of the transmissive pattern is formed in a sub-wavelength size having a predetermined period, and has various shapes including a circular shape, an oval shape, a quadrangular shape, a triangular shape, and a slit shape.

23. The method of claim 11, wherein the insulating layer is formed to have a thickness of 10 nm~1000 nm.

24. The method of claim 11, wherein the insulating layer is formed by using one of a gas phase method, a liquid phase method, a solid phase method, and a nanosol coating method.

25. The method of claim 11, wherein the insulating layer serves as an over coating layer.

* * * * *